United States Patent
Lee et al.

(10) Patent No.: US 8,912,666 B2
(45) Date of Patent: Dec. 16, 2014

(54) STRUCTURE AND MANUFACTURING METHOD OF CHIP SCALE PACKAGE

(71) Applicant: Megica Corporation, Hsinchu (TW)

(72) Inventors: Jin-Yuan Lee, Hsinchu (TW);
Ching-Cheng Huang, Hsinchu (TW);
Mou-Shiung Lin, Hsinchu (TW)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 13/853,878

(22) Filed: Mar. 29, 2013

(65) Prior Publication Data

US 2013/0221512 A1 Aug. 29, 2013

Related U.S. Application Data

(63) Continuation of application No. 12/512,073, filed on Jul. 30, 2009, now Pat. No. 8,426,982, which is a continuation of application No. 12/202,341, filed on Sep. 1, 2008, now abandoned, which is a continuation of application No. 09/821,546, filed on Mar. 30, 2001, now Pat. No. 7,498,196.

(51) Int. Cl.
*H01L 23/48* (2006.01)
*H01L 23/02* (2006.01)

(52) U.S. Cl.
USPC ............................. 257/778; 257/678; 257/781

(58) Field of Classification Search
USPC .......... 257/678, 778, 781, E21.503, E21.508, 257/E21.511, E23.021, 738; 438/106, 108, 438/614
See application file for complete search history.

(56) References Cited

U.S. PATENT DOCUMENTS

| | | | |
|---|---|---|---|
| 3,903,590 | A | 9/1975 | Yokogawa |
| 4,606,962 | A | 8/1986 | Reylek et al. |
| 4,840,923 | A | 6/1989 | Flagello et al. |
| 4,866,501 | A | 9/1989 | Shanefield |

(Continued)

FOREIGN PATENT DOCUMENTS

| | | |
|---|---|---|
| JP | 2000003985 A | 1/2000 |
| TW | 395000 B | 6/2000 |

(Continued)

OTHER PUBLICATIONS

Bohr M., "The New Era of Scaling in an SoC World," International Solid-State Circuits Conference, 2009, pp. 23-28.

(Continued)

*Primary Examiner* — Hung Vu
(74) *Attorney, Agent, or Firm* — Seyfarth Shaw LLP

(57) ABSTRACT

A Chip Scale Package (CSP) and a method of forming the same are disclosed. Single chips without the conventional ball mountings, are first attached to an adhesive-substrate (adsubstrate) composite having openings that correspond to the input/output (I/O) pads on the single chips to form a composite chip package. Ball mounting is then performed over the openings, thus connecting the I/O pads at the chip sites to the next level of packaging directly. In another embodiment, the adhesive layer is formed on the wafer side first to form an adwafer, which is then die sawed in CSPs. Then the CSPs with the adhesive already on them are bonded to a substrate. The composite chip package may optionally be encapsulated with a molding material. The CSPs provide integrated and shorter chip connections especially suited for high frequency circuit applications, and can leverage the currently existing test infrastructure.

22 Claims, 10 Drawing Sheets

(56) References Cited

U.S. PATENT DOCUMENTS

| | | | |
|---|---|---|---|
| 5,081,563 | A | 1/1992 | Feng et al. |
| 5,111,278 | A | 5/1992 | Eichelberger |
| 5,148,265 | A | 9/1992 | Khandros et al. |
| 5,148,266 | A | 9/1992 | Khandros et al. |
| 5,196,377 | A | 3/1993 | Wagner et al. |
| 5,241,456 | A | 8/1993 | Marcinkiewicz et al. |
| 5,250,843 | A | 10/1993 | Eichelberger |
| 5,258,330 | A | 11/1993 | Khandros et al. |
| 5,281,151 | A | 1/1994 | Arima et al. |
| 5,282,312 | A | 2/1994 | DiStefano et al. |
| 5,291,066 | A | 3/1994 | Neugebauer et al. |
| 5,300,812 | A | 4/1994 | Lupinski et al. |
| 5,324,687 | A | 6/1994 | Wojnarowski |
| 5,346,861 | A | 9/1994 | Khandros et al. |
| 5,347,159 | A | 9/1994 | Khandros et al. |
| 5,353,498 | A | 10/1994 | Fillion et al. |
| 5,366,906 | A | 11/1994 | Wojnarowski et al. |
| 5,434,751 | A | 7/1995 | Cole, Jr. et al. |
| 5,450,101 | A | 9/1995 | Ishida et al. |
| 5,455,455 | A | 10/1995 | Badehi |
| 5,480,835 | A | 1/1996 | Carney et al. |
| 5,518,964 | A | 5/1996 | DiStefano et al. |
| 5,524,339 | A | 6/1996 | Gorowitz et al. |
| 5,541,442 | A | 7/1996 | Keil et al. |
| 5,547,906 | A | 8/1996 | Badehi |
| 5,548,091 | A | 8/1996 | DiStefano et al. |
| 5,548,099 | A | 8/1996 | Cole, Jr. et al. |
| 5,554,887 | A | 9/1996 | Sawai et al. |
| 5,565,706 | A | 10/1996 | Miura et al. |
| 5,570,504 | A | 11/1996 | DiStefano et al. |
| 5,583,321 | A | 12/1996 | DiStefano et al. |
| 5,640,761 | A | 6/1997 | DiStefano et al. |
| 5,648,448 | A | 7/1997 | Marrocco, III |
| 5,656,863 | A | 8/1997 | Yasunaga et al. |
| 5,659,952 | A | 8/1997 | Kovac et al. |
| 5,663,106 | A | 9/1997 | Karavakis et al. |
| 5,679,977 | A | 10/1997 | Khandros et al. |
| 5,682,061 | A | 10/1997 | Khandros et al. |
| 5,685,885 | A | 11/1997 | Khandros et al. |
| 5,688,716 | A | 11/1997 | DiStefano et al. |
| 5,706,174 | A | 1/1998 | DiStefano et al. |
| 5,734,201 | A | 3/1998 | Djennas et al. |
| 5,745,984 | A | 5/1998 | Cole, Jr. et al. |
| 5,757,072 | A | 5/1998 | Gorowitz et al. |
| 5,757,079 | A | 5/1998 | McAllister et al. |
| 5,766,987 | A | 6/1998 | Mitchell et al. |
| 5,776,796 | A | 7/1998 | DiStefano et al. |
| 5,777,379 | A | 7/1998 | Karavakis et al. |
| 5,798,286 | A | 8/1998 | Faraci et al. |
| 5,801,441 | A | 9/1998 | DiStefano et al. |
| 5,810,609 | A | 9/1998 | Faraci et al. |
| 5,812,378 | A | 9/1998 | Fjelstad et al. |
| 5,821,608 | A | 10/1998 | DiStefano et al. |
| 5,821,609 | A | 10/1998 | DiStefano et al. |
| 5,830,782 | A | 11/1998 | Smith et al. |
| 5,834,339 | A | 11/1998 | DiStefano et al. |
| 5,841,193 | A | 11/1998 | Eichelberger |
| 5,846,875 | A | 12/1998 | Haji |
| 5,847,936 | A | 12/1998 | Forehand et al. |
| 5,848,467 | A | 12/1998 | Khandros et al. |
| 5,852,326 | A | 12/1998 | Khandros et al. |
| 5,854,740 | A | 12/1998 | Cha |
| 5,861,666 | A | 1/1999 | Bellaar |
| 5,866,949 | A | 2/1999 | Schueller |
| 5,874,770 | A | 2/1999 | Saia et al. |
| 5,875,545 | A | 3/1999 | DiStefano et al. |
| 5,882,956 | A | 3/1999 | Umehara et al. |
| 5,894,107 | A | 4/1999 | Lee et al. |
| 5,913,109 | A | 6/1999 | DiStefano et al. |
| 5,914,533 | A | 6/1999 | Frech et al. |
| 5,915,170 | A | 6/1999 | Raab et al. |
| 5,919,548 | A | 7/1999 | Barron et al. |
| 5,925,934 | A | 7/1999 | Lim |
| 5,929,517 | A | 7/1999 | DiStefano et al. |
| 5,932,254 | A | 8/1999 | Mitchell et al. |
| 5,932,379 | A | 8/1999 | Burm et al. |
| 5,939,782 | A | 8/1999 | Malladi |
| 5,950,304 | A | 9/1999 | Khandros et al. |
| 5,959,354 | A | 9/1999 | Smith et al. |
| 5,959,357 | A | 9/1999 | Korman |
| 5,969,426 | A | 10/1999 | Baba et al. |
| 5,982,018 | A | 11/1999 | Wark et al. |
| 5,983,492 | A | 11/1999 | Fjelstad |
| 5,989,936 | A | 11/1999 | Smith et al. |
| 5,994,766 | A | 11/1999 | Shenoy et al. |
| 5,994,781 | A | 11/1999 | Smith |
| 6,004,867 | A | 12/1999 | Kim et al. |
| 6,012,224 | A | 1/2000 | DiStefano et al. |
| 6,013,948 | A | 1/2000 | Akram et al. |
| 6,025,995 | A | 2/2000 | Marcinkiewicz |
| 6,030,856 | A | 2/2000 | DiStefano et al. |
| 6,040,235 | A | 3/2000 | Badehi |
| 6,043,109 | A | 3/2000 | Yang et al. |
| 6,045,655 | A | 4/2000 | DiStefano et al. |
| 6,046,076 | A | 4/2000 | Mitchell et al. |
| 6,054,337 | A | 4/2000 | Solberg |
| 6,063,648 | A | 5/2000 | Beroz et al. |
| 6,064,114 | A | 5/2000 | Higgins, III |
| 6,071,755 | A | 6/2000 | Baba et al. |
| 6,072,236 | A | 6/2000 | Akram et al. |
| 6,075,289 | A | 6/2000 | DiStefano |
| 6,075,710 | A | 6/2000 | Lau |
| 6,080,603 | A | 6/2000 | DiStefano et al. |
| 6,080,605 | A | 6/2000 | DiStefano et al. |
| 6,087,199 | A | 7/2000 | Pogge et al. |
| 6,093,584 | A | 7/2000 | Fjelstad |
| 6,096,574 | A | 8/2000 | Smith |
| 6,104,087 | A | 8/2000 | DiStefano et al. |
| 6,107,123 | A | 8/2000 | DiStefano et al. |
| 6,117,707 | A | 9/2000 | Badehi |
| 6,117,964 | A | 9/2000 | Falcone |
| 6,118,183 | A | 9/2000 | Umehara et al. |
| 6,121,676 | A | 9/2000 | Solberg |
| 6,121,688 | A | 9/2000 | Akagawa |
| 6,124,634 | A | 9/2000 | Akram et al. |
| 6,126,428 | A | 10/2000 | Mitchell et al. |
| 6,127,724 | A | 10/2000 | DiStefano |
| 6,130,116 | A | 10/2000 | Smith et al. |
| 6,133,627 | A | 10/2000 | Khandros et al. |
| 6,133,639 | A | 10/2000 | Kovac et al. |
| 6,137,164 | A | 10/2000 | Yew et al. |
| 6,147,400 | A | 11/2000 | Faraci et al. |
| 6,147,401 | A | 11/2000 | Solberg |
| 6,154,366 | A | 11/2000 | Ma et al. |
| 6,159,767 | A | 12/2000 | Eichelberger |
| 6,165,814 | A | 12/2000 | Wark et al. |
| 6,165,885 | A | 12/2000 | Gaynes et al. |
| 6,168,965 | B1 | 1/2001 | Malinovich et al. |
| 6,169,328 | B1 | 1/2001 | Mitchell et al. |
| 6,175,161 | B1 | 1/2001 | Goetz et al. |
| 6,177,636 | B1 | 1/2001 | Fjelstad |
| 6,177,731 | B1 | 1/2001 | Ishida et al. |
| 6,180,445 | B1 | 1/2001 | Tsai |
| 6,187,615 | B1 | 2/2001 | Kim et al. |
| 6,191,368 | B1 | 2/2001 | Di Stefano et al. |
| 6,194,291 | B1 | 2/2001 | DiStefano et al. |
| 6,202,298 | B1 | 3/2001 | Smith |
| 6,202,299 | B1 | 3/2001 | DiStefano et al. |
| 6,204,091 | B1 | 3/2001 | Smith et al. |
| 6,207,548 | B1 | 3/2001 | Akram et al. |
| 6,211,572 | B1 | 4/2001 | Fjelstad et al. |
| 6,214,640 | B1 | 4/2001 | Fosberry et al. |
| 6,215,191 | B1 | 4/2001 | Beroz et al. |
| 6,217,972 | B1 | 4/2001 | Beroz et al. |
| 6,218,215 | B1 | 4/2001 | DiStefano et al. |
| 6,225,692 | B1 | 5/2001 | Hinds |
| 6,228,685 | B1 | 5/2001 | Beroz et al. |
| 6,228,686 | B1 | 5/2001 | Smith et al. |
| 6,228,687 | B1 | 5/2001 | Akram et al. |
| 6,229,100 | B1 | 5/2001 | Fjelstad |
| 6,232,147 | B1 | 5/2001 | Matsuki et al. |
| 6,232,152 | B1 | 5/2001 | DiStefano et al. |
| 6,235,552 | B1 | 5/2001 | Kwon et al. |
| 6,236,098 | B1 | 5/2001 | Efland et al. |

(56) References Cited

U.S. PATENT DOCUMENTS

| | | | |
|---|---|---|---|
| 6,239,384 | B1 | 5/2001 | Smith et al. |
| 6,242,282 | B1 | 6/2001 | Fillion et al. |
| 6,245,595 | B1 | 6/2001 | Nguyen et al. |
| 6,248,656 | B1 | 6/2001 | Baker et al. |
| 6,255,723 | B1 | 7/2001 | Light et al. |
| 6,255,738 | B1 | 7/2001 | DiStefano et al. |
| 6,265,759 | B1 | 7/2001 | DiStefano et al. |
| 6,265,765 | B1 | 7/2001 | DiStefano et al. |
| 6,265,782 | B1 | 7/2001 | Yamamoto et al. |
| 6,274,391 | B1 | 8/2001 | Wachtler et al. |
| 6,277,669 | B1 | 8/2001 | Kung et al. |
| 6,281,588 | B1 | 8/2001 | Di Stefano et al. |
| 6,284,563 | B1 | 9/2001 | Fjelstad |
| 6,286,205 | B1 | 9/2001 | Faraci et al. |
| 6,287,893 | B1 | 9/2001 | Elenius et al. |
| 6,294,040 | B1 | 9/2001 | Raab et al. |
| 6,297,553 | B1 | 10/2001 | Horiuchi et al. |
| 6,300,231 | B1 | 10/2001 | Haba et al. |
| 6,306,680 | B1 * | 10/2001 | Fillion et al. ............... 438/106 |
| 6,307,260 | B1 | 10/2001 | Smith et al. |
| 6,309,915 | B1 | 10/2001 | DiStefano |
| 6,312,972 | B1 | 11/2001 | Blackshear |
| 6,313,528 | B1 | 11/2001 | Solberg |
| 6,319,827 | B1 | 11/2001 | Kowalski et al. |
| 6,329,224 | B1 | 12/2001 | Nguyen et al. |
| 6,329,605 | B1 | 12/2001 | Beroz et al. |
| 6,329,607 | B1 | 12/2001 | Fjelstad et al. |
| 6,338,982 | B1 | 1/2002 | Beroz et al. |
| 6,344,401 | B1 | 2/2002 | Lam |
| 6,344,695 | B1 | 2/2002 | Murayama |
| 6,348,728 | B1 | 2/2002 | Aiba et al. |
| 6,350,668 | B1 | 2/2002 | Chakravorty |
| 6,354,485 | B1 | 3/2002 | DiStefano |
| 6,355,507 | B1 | 3/2002 | Fanworth |
| 6,358,780 | B1 | 3/2002 | Smith et al. |
| 6,359,236 | B1 | 3/2002 | DiStefano et al. |
| 6,359,335 | B1 | 3/2002 | DiStefano et al. |
| 6,361,959 | B1 | 3/2002 | Beroz et al. |
| 6,365,436 | B1 | 4/2002 | Faraci et al. |
| 6,365,975 | B1 | 4/2002 | DiStefano et al. |
| 6,370,032 | B1 | 4/2002 | DiStefano et al. |
| 6,372,527 | B1 | 4/2002 | Khandros et al. |
| 6,373,141 | B1 | 4/2002 | DiStefano et al. |
| 6,376,279 | B1 | 4/2002 | Kwon et al. |
| 6,378,758 | B1 | 4/2002 | Haba |
| 6,383,858 | B1 | 5/2002 | Gupta et al. |
| 6,384,473 | B1 | 5/2002 | Peterson et al. |
| 6,384,475 | B1 | 5/2002 | Beroz et al. |
| 6,388,340 | B2 | 5/2002 | DiStefano |
| 6,392,306 | B1 | 5/2002 | Khandros et al. |
| 6,396,148 | B1 | 5/2002 | Eichelberger et al. |
| 6,400,573 | B1 | 6/2002 | Mowatt et al. |
| 6,414,390 | B2 | 7/2002 | Nozawa |
| 6,420,661 | B1 | 7/2002 | Di Stefano et al. |
| 6,423,570 | B1 | 7/2002 | Ma et al. |
| 6,423,907 | B1 | 7/2002 | Haba et al. |
| 6,429,112 | B1 | 8/2002 | Smith et al. |
| 6,433,419 | B2 | 8/2002 | Khandros et al. |
| 6,448,171 | B1 | 9/2002 | Wang et al. |
| 6,458,623 | B1 | 10/2002 | Goldmann et al. |
| 6,458,628 | B1 | 10/2002 | DiStefano et al. |
| 6,458,681 | B1 | 10/2002 | DiStefano et al. |
| 6,458,682 | B2 | 10/2002 | Watanabe |
| 6,459,150 | B1 | 10/2002 | Wu et al. |
| 6,460,245 | B1 | 10/2002 | DiStefano |
| 6,465,744 | B2 | 10/2002 | Baker et al. |
| 6,465,878 | B2 | 10/2002 | Fjelstad et al. |
| 6,465,893 | B1 | 10/2002 | Khandros et al. |
| 6,468,836 | B1 | 10/2002 | DiStefano et al. |
| 6,476,506 | B1 | 11/2002 | O'Connor et al. |
| 6,476,507 | B1 | 11/2002 | Takehara |
| 6,482,730 | B1 | 11/2002 | Masumoto et al. |
| 6,486,003 | B1 | 11/2002 | Fjelstad |
| 6,486,547 | B2 | 11/2002 | Smith et al. |
| 6,492,201 | B1 | 12/2002 | Haba |
| 6,492,251 | B1 | 12/2002 | Haba et al. |
| 6,492,829 | B1 | 12/2002 | Miura et al. |
| 6,495,462 | B1 | 12/2002 | Haba et al. |
| 6,499,216 | B1 | 12/2002 | Fjelstad |
| 6,504,227 | B1 | 1/2003 | Matsuo et al. |
| 6,507,122 | B2 | 1/2003 | Blackshear |
| 6,518,662 | B1 | 2/2003 | Smith et al. |
| 6,521,480 | B1 | 2/2003 | Mitchell et al. |
| 6,525,429 | B1 | 2/2003 | Kovac et al. |
| 6,538,210 | B2 | 3/2003 | Sugaya et al. |
| 6,541,310 | B1 | 4/2003 | Lo et al. |
| 6,541,852 | B2 | 4/2003 | Beroz et al. |
| 6,541,874 | B2 | 4/2003 | Nguyen et al. |
| 6,543,131 | B1 | 4/2003 | Beroz et al. |
| 6,555,469 | B1 | 4/2003 | MacIntyre |
| 6,555,908 | B1 | 4/2003 | Eichelberger et al. |
| 6,557,253 | B1 | 5/2003 | Haba et al. |
| 6,558,976 | B2 | 5/2003 | Shrauger |
| 6,570,101 | B2 | 5/2003 | Stefano et al. |
| 6,573,584 | B1 | 6/2003 | Nagakari et al. |
| 6,573,609 | B2 | 6/2003 | Fjelstad et al. |
| 6,602,740 | B1 | 8/2003 | Mitchell |
| 6,620,720 | B1 * | 9/2003 | Moyer et al. ............... 438/612 |
| 6,624,505 | B2 | 9/2003 | Badehi |
| 6,625,037 | B2 | 9/2003 | Nakatani et al. |
| 6,632,733 | B2 | 10/2003 | Mohammed |
| 6,635,514 | B1 | 10/2003 | Fjelstad |
| 6,635,553 | B1 | 10/2003 | DiStefano et al. |
| 6,639,324 | B1 | 10/2003 | Chien |
| 6,651,321 | B2 | 11/2003 | Beroz et al. |
| 6,653,172 | B2 | 11/2003 | DiStefano et al. |
| 6,657,286 | B2 | 12/2003 | Light |
| 6,664,484 | B2 | 12/2003 | Haba et al. |
| 6,664,621 | B2 | 12/2003 | Smith et al. |
| 6,686,015 | B2 | 2/2004 | Raab et al. |
| 6,687,842 | B1 | 2/2004 | DiStefano et al. |
| 6,690,186 | B2 | 2/2004 | Fjelstad |
| 6,699,730 | B2 | 3/2004 | Kim et al. |
| 6,707,124 | B2 | 3/2004 | Wachtler et al. |
| 6,707,159 | B1 | 3/2004 | Kumamoto et al. |
| 6,709,895 | B1 | 3/2004 | DiStefano |
| 6,710,454 | B1 | 3/2004 | Boon |
| 6,713,589 | B2 | 3/2004 | Sue et al. |
| 6,723,584 | B2 | 4/2004 | Kovac et al. |
| 6,734,534 | B1 | 5/2004 | Vu et al. |
| 6,737,265 | B2 | 5/2004 | Beroz et al. |
| 6,750,539 | B2 | 6/2004 | Haba et al. |
| 6,763,579 | B2 | 7/2004 | Haba et al. |
| 6,765,299 | B2 | 7/2004 | Takahashi et al. |
| 6,774,317 | B2 | 8/2004 | Fjelstad |
| 6,777,767 | B2 | 8/2004 | Badehi |
| 6,780,747 | B2 | 8/2004 | DiStefano et al. |
| 6,820,330 | B1 | 11/2004 | Haba |
| 6,821,815 | B2 | 11/2004 | Smith et al. |
| 6,822,320 | B2 | 11/2004 | Haba |
| 6,826,827 | B1 | 12/2004 | Fjelstad |
| 6,828,668 | B2 | 12/2004 | Smith et al. |
| 6,838,750 | B2 | 1/2005 | Nuytkens et al. |
| 6,847,101 | B2 | 1/2005 | Fjelstad et al. |
| 6,847,107 | B2 | 1/2005 | Fjelstad et al. |
| 6,848,173 | B2 | 2/2005 | Fjelstad et al. |
| 6,856,007 | B2 | 2/2005 | Warner |
| 6,867,065 | B2 | 3/2005 | Beroz |
| 6,867,499 | B1 | 3/2005 | Tabrizi |
| 6,870,272 | B2 | 3/2005 | Kovac et al. |
| 6,876,212 | B2 | 4/2005 | Fjelstad |
| 6,885,106 | B1 | 4/2005 | Damberg et al. |
| 6,924,171 | B2 | 8/2005 | Buchwalter et al. |
| 6,952,047 | B2 | 10/2005 | Li |
| 6,965,158 | B2 | 11/2005 | Smith et al. |
| 6,972,480 | B2 | 12/2005 | Zilber et al. |
| 7,012,323 | B2 | 3/2006 | Warner et al. |
| 7,033,664 | B2 | 4/2006 | Zilber et al. |
| 7,098,078 | B2 | 8/2006 | Khandros et al. |
| 7,112,879 | B2 | 9/2006 | Fjelstad et al. |
| 7,114,250 | B2 | 10/2006 | Haba et al. |
| 7,138,299 | B2 | 11/2006 | Fjelstad |
| 7,144,745 | B2 | 12/2006 | Badehi |
| 7,149,095 | B2 | 12/2006 | Warner et al. |

(56) References Cited

U.S. PATENT DOCUMENTS

| | | |
|---|---|---|
| 7,152,311 B2 | 12/2006 | Beroz et al. |
| 7,166,914 B2 | 1/2007 | DiStefano et al. |
| 7,176,506 B2 | 2/2007 | Beroz et al. |
| 7,183,643 B2 | 2/2007 | Gibson et al. |
| 7,192,796 B2 | 3/2007 | Zilber et al. |
| 7,198,969 B1 | 4/2007 | Khandros et al. |
| 7,208,820 B2 | 4/2007 | Mohammed |
| 7,229,850 B2 | 6/2007 | Li |
| 7,265,440 B2 | 9/2007 | Zilber et al. |
| 7,268,426 B2 | 9/2007 | Warner et al. |
| 7,271,481 B2 | 9/2007 | Khandros et al. |
| 7,272,888 B2 | 9/2007 | DiStefano |
| 7,291,910 B2 | 11/2007 | Khandros et al. |
| 7,368,818 B2 | 5/2008 | Kovac et al. |
| 7,408,260 B2 | 8/2008 | Fjelstad et al. |
| 7,408,261 B2 | 8/2008 | Yoon et al. |
| 7,427,423 B2 | 9/2008 | Beroz et al. |
| 7,449,412 B2 | 11/2008 | Nuytkens et al. |
| 7,454,834 B2 | 11/2008 | DiStefano |
| 7,462,932 B2 | 12/2008 | Haba et al. |
| 7,498,196 B2 | 3/2009 | Lee et al. |
| 7,528,008 B2 | 5/2009 | Fjelstad |
| 7,531,894 B2 | 5/2009 | Fjelstad |
| 7,566,955 B2 | 7/2009 | Warner |
| 7,589,409 B2 | 9/2009 | Gibson et al. |
| 7,754,537 B2 | 7/2010 | Haba et al. |
| 8,426,982 B2 * | 4/2013 | Lee et al. ............. 257/778 |
| 2001/0000032 A1 | 3/2001 | Smith et al. |
| 2001/0005044 A1 | 6/2001 | Fjelstad |
| 2001/0021541 A1 | 9/2001 | Akram et al. |
| 2001/0022396 A1 | 9/2001 | DiStefano et al. |
| 2001/0030370 A1 | 10/2001 | Khandros et al. |
| 2001/0031514 A1 | 10/2001 | Smith |
| 2001/0033474 A1 | 10/2001 | Sakai et al. |
| 2001/0037863 A1 | 11/2001 | Carson et al. |
| 2001/0040290 A1 | 11/2001 | Sakurai et al. |
| 2001/0042901 A1 | 11/2001 | Maruyama |
| 2002/0001966 A1 | 1/2002 | Ito et al. |
| 2002/0004288 A1 | 1/2002 | Nishiyama |
| 2002/0009827 A1 | 1/2002 | Beroz et al. |
| 2002/0017730 A1 | 2/2002 | Tahara et al. |
| 2002/0030273 A1 | 3/2002 | Iwamoto et al. |
| 2002/0063304 A1 | 5/2002 | Toeda et al. |
| 2002/0074641 A1 | 6/2002 | Towle et al. |
| 2002/0079575 A1 | 6/2002 | Hozoji et al. |
| 2002/0084510 A1 | 7/2002 | Jun et al. |
| 2002/0115236 A1 | 8/2002 | Fjelstad et al. |
| 2002/0121689 A1 | 9/2002 | Honda |
| 2002/0135063 A1 | 9/2002 | Alcoe et al. |
| 2002/0137263 A1 | 9/2002 | Towle et al. |
| 2002/0142521 A1 | 10/2002 | Steffens |
| 2002/0158334 A1 | 10/2002 | Vu et al. |
| 2002/0163055 A1 | 11/2002 | Thomas |
| 2002/0168797 A1 | 11/2002 | DiStefano et al. |
| 2002/0170746 A1 | 11/2002 | Master et al. |
| 2002/0180041 A1 | 12/2002 | Sahara et al. |
| 2003/0020180 A1 | 1/2003 | Ahn et al. |
| 2003/0080437 A1 | 5/2003 | Gonzalez et al. |
| 2003/0118738 A1 | 6/2003 | Shuy et al. |
| 2004/0035519 A1 | 2/2004 | Beroz et al. |
| 2005/0087855 A1 | 4/2005 | Khandros et al. |
| 2005/0139986 A1 | 6/2005 | Kovac et al. |
| 2005/0155223 A1 | 7/2005 | Fjelstad et al. |
| 2005/0218495 A1 | 10/2005 | Khandros et al. |
| 2006/0001152 A1 | 1/2006 | Hu |
| 2006/0113645 A1 | 6/2006 | Warner et al. |
| 2006/0237836 A1 | 10/2006 | Fjelstad et al. |
| 2007/0096160 A1 | 5/2007 | Beroz et al. |
| 2008/0012115 A1 | 1/2008 | Zilber et al. |
| 2008/0315424 A1 | 12/2008 | Lee et al. |
| 2009/0008778 A1 * | 1/2009 | Lee et al. ............. 257/738 |
| 2009/0011542 A1 | 1/2009 | Lee et al. |
| 2009/0200654 A1 | 8/2009 | Fjelstad |
| 2009/0200655 A1 | 8/2009 | Fjelstad |
| 2009/0236406 A1 | 9/2009 | Fjelstad |
| 2010/0013108 A1 | 1/2010 | Gibson et al. |

FOREIGN PATENT DOCUMENTS

| | | |
|---|---|---|
| TW | 408855 U | 10/2000 |
| TW | 413399 U | 11/2000 |
| TW | 426226 U | 3/2001 |
| TW | 429563 B | 4/2001 |
| TW | 456006 B | 9/2001 |
| TW | 466655 B | 12/2001 |
| WO | 9609746 A1 | 3/1996 |
| WO | 9711588 A1 | 3/1997 |
| WO | 9828955 A2 | 7/1998 |
| WO | 9844564 A1 | 10/1998 |
| WO | 9940761 A1 | 8/1999 |
| WO | 0054321 A1 | 9/2000 |
| WO | 03021673 A1 | 3/2003 |
| WO | 2004080134 A2 | 9/2004 |

OTHER PUBLICATIONS

Bohr M., "The New Era of Scaling in an SoC World," International Solid-State Circuits Conference (2009) Presentation Slides 1-66.

Edelstein D., et al., "Full Copper Wiring in a Sub-0.25 pm CMOS ULS Technology," Technical Digest IEEE International Electron Devices Meeting, 1997, pp. 773-776.

Edelstein D.C., "Advantages of Copper Interconnects," Proceedings of the 12th International IEEE VLSI Multilevel Interconnection Conference, 1995, pp. 301-307.

Gao X., et al., "An Improved Electrostatic Discharge Protection Structure for Reducing Triggering Voltage and Parasitic Capacitance," Solid-State Electronics, 2003, pp. 1105-1110.

Geffken R.M., "An Overview of Polyimide Use in Integrated Circuits and Packaging," Proceedings of the Third International Symposium on Ultra Large Scale Integration Science and Technology, 1991, pp. 667-677.

Groves R., et al., "High Q Inductors in a SiGe BiCMOS Process Utilizing Thick Metal Process Add-on Module," Proceedings of the Bipolar/BiCMOS Circuits and Technology Meeting, 1999, pp. 149-152.

Hiraiwa K., et al., "Advanced LSI Packaging Technologies," Fujitsu Scientific & Technical Journal, 1, Jun. 2000, pp. 99-107, vol. 36.

Hu C.K., et al., "Copper-Polyimide Wiring Technology for VLSI Circuits," Materials Research Society Symposium Proceedings VLSI V, 1990, pp. 369-373.

Ingerly D., et al., "Low-K Interconnect Stack with Thick Metal 9 Redistribution Layer and Cu Die Bump for 45nm High Volume Manufacturing," International Interconnect Technology Conference, 2008, pp. 216-218.

Jenei S., et al., "High Q Inductor Add-on Module in Thick Cu/SiLK Single Damascene," Proceedings from the IEEE International Interconnect Technology Conference, 2001, pp. 107-109.

Kumar R., et al., "A Family of 45nm IA Processors," IEEE International Solid-State Circuits Conference, 2009, pp. 58-59, vol. 3 (2), Session 3, Microprocessor Technologies.

Kurd N., et al., "Next Generation Intel® Micro-architecture (Nehalem) Clocking Architecture," Symposium on VLSI Circuits Digest of Technical Papers, 2008, pp. 62-63.

Lau, J. et al. "Chip Scale Package—Design Materials Process Reliability and Applications", Chapt 10, pp. 157-161, McGraw-Hill professional, 1990.

Lee Y.H., et al., "Effect of ESD Layout on the Assembly Yield and Reliability," International Electron Devices Meeting, 2006, pp. 1-4.

Lin M.S., et al., "A New IC Interconnection Scheme and Design Architecture for High Performance ICs at Very Low Fabrication Cost—Post Passivation Interconnection," Proceedings of the IEEE Custom Integrated Circuits Conference, 2003, pp. 533-536.

Lin M.S., et al., "A New System-on-a-Chip (SOC) Technology High Q Post Passivation Inductors," Proceedings from the 53rd Electronic Components and Technology Conference (May 30, 2003), 2003, pp. 1503-1509.

(56) References Cited

OTHER PUBLICATIONS

Lin, M.S. "Post Passivation Technology—MEGIC Way to System Solutions", Presentation given at TSMC Technology Symposium, Japan (Oct. 1, 2003) pp. 1-32.

Luther B., et al., "Planar Copper-Polyimide Back End of the Line Interconnections for ULSI Devices," Proceedings of the 10th International IEEE VLSI Multilevel Interconnection Conference, 1993, pp. 15-21.

Maloney T., et al., "Novel Clamp Circuits for IC Power Supply Protection," IEEE Transactions on Components, Packaging, and Manufacturing Technology, Part C, 1996, pp. 150-161, vol. 19 (3).

Maloney T.J., et al., "Stacked PMOS Clamps for High Voltage Power Supply Protection," Electrical Overstress Electrostatic Discharge Symposium Proceedings, 1999, pp. 70-77.

Master R., et al., "Ceramic Mini-Ball Grid Array Package for High Speed Device," Proceedings from the 45th Electronic Components and Technology Conference, 1995, pp. 46-50.

Megic Corp., "Megic way to system solutions through bumping and redistribution", Brochure, Megic Corp, 2004, pp. 1-3.

Millman, Jacob; "Microelectronics Second Edition, McGraw Hill series in Electrical and Computer Engineering: Digital and Analog Circuits and Systems"; pp. 115 and 167 (1987).

Mistry K., et al., "A 45nm Logic Technology with High-k Metal Gate Transistors, Strained Silicon, 9 Cu Interconnect Layers, 193nm Dry Patterning, and 100% Pb-free Packaging," IEEE International Electron Devices Meeting, 2007, pp. 247-250.

Roesch W., et al., "Cycling Copper Flip Chip Interconnects," Microelectronics Reliability, 2004, pp. 1047-1054, vol. 44.

Sakran N., et al., "The Implementation of the 65nm Dual-Core 64b Merom Processor, Session 5, Microprocessors," IEEE International Solid-State Circuits Conference, 2007, pp. 106-107 and 590, vol. 5 (6).

Theng C., et al., "An Automated Tool Deployment for ESD (Electro-Static- Discharge) Correct-by-Construction Strategy in 90 nm Process," IEEE International Conference on Semiconductor Electronics, 2004, pp. 61-67.

Tummala R.R., et al., "An Overview & 8-2 Chip-Level Interconnection Evolution, Springer", Technology Drivers Part I, Jan. 31, 1997, pp. 12-13,64-65,82-87,133, Microelectronics Packaging Handbook ,Springer (Second Edition).

Venkatesan S., et al., "A High Performance 1.8V, 0.20 pm CMOS Technology with Copper Metallization," Technical Digest IEEE International Electron Devices Meeting, 1997, pp. 769-772.

Yeoh A., et al., "Copper Die Bumps (First Level Interconnect) and Low-K Dielectrics in 65nm High Volume Manufacturing," Electronic Components and Technology Conference, 2006, pp. 1611-1615.

Yeoh T.S., "ESD Effects on Power Supply Clamps," Proceedings of the 6th International Symposium on Physical & Failure Analysis of Integrated Circuits, 1997, pp. 121-124.

* cited by examiner

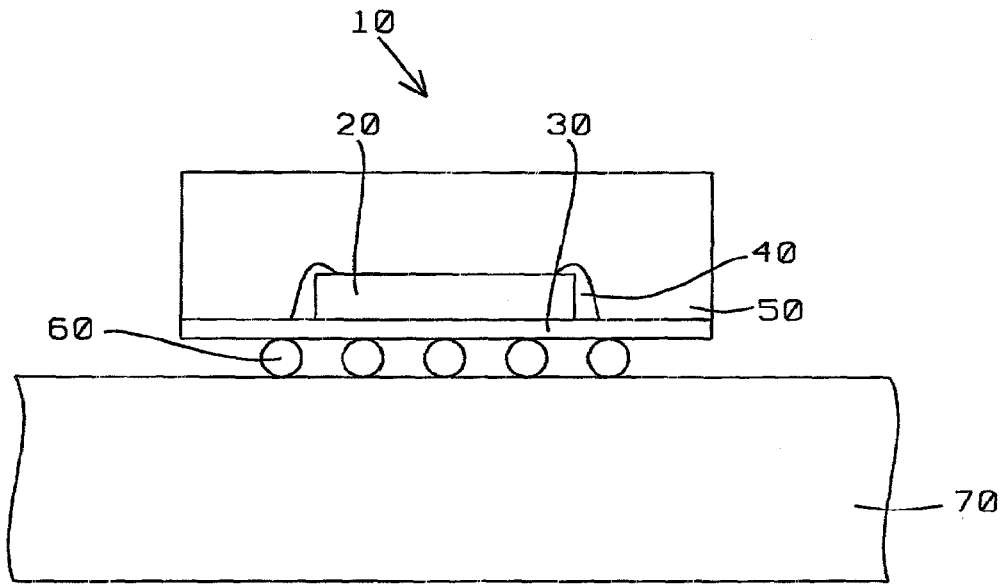
FIG. 1 — Prior Art
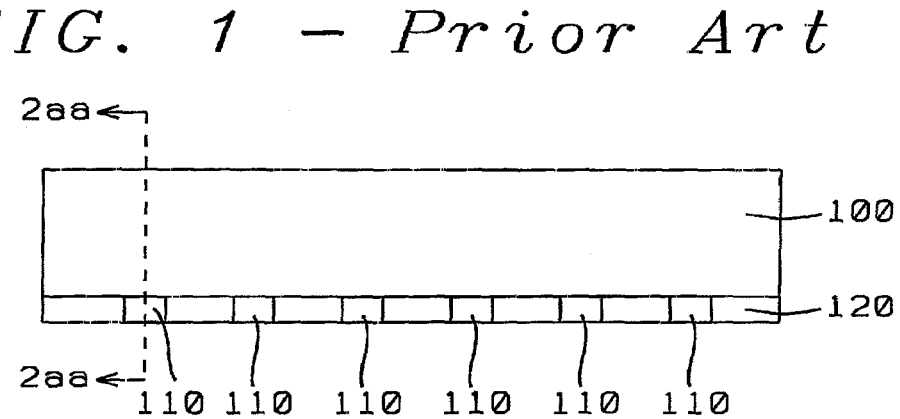
FIG. 2a
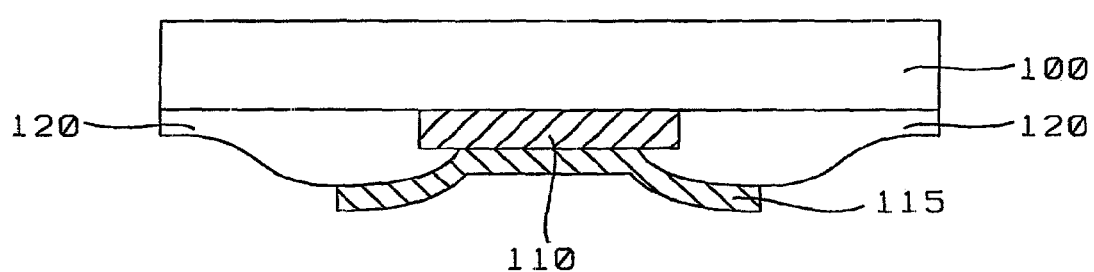
FIG. 2aa

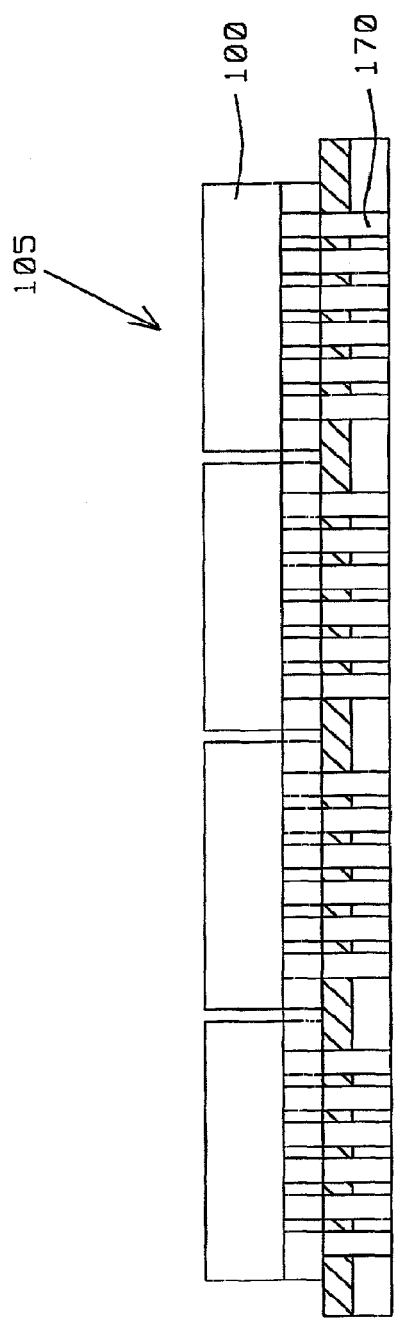
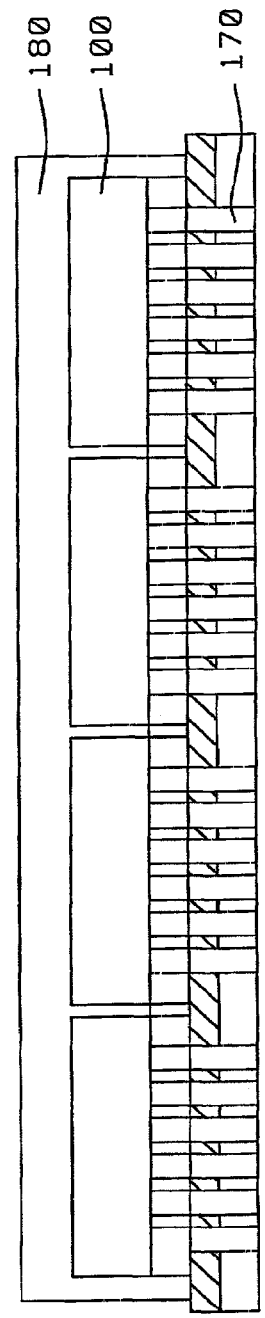
FIG. 2f
FIG. 2g

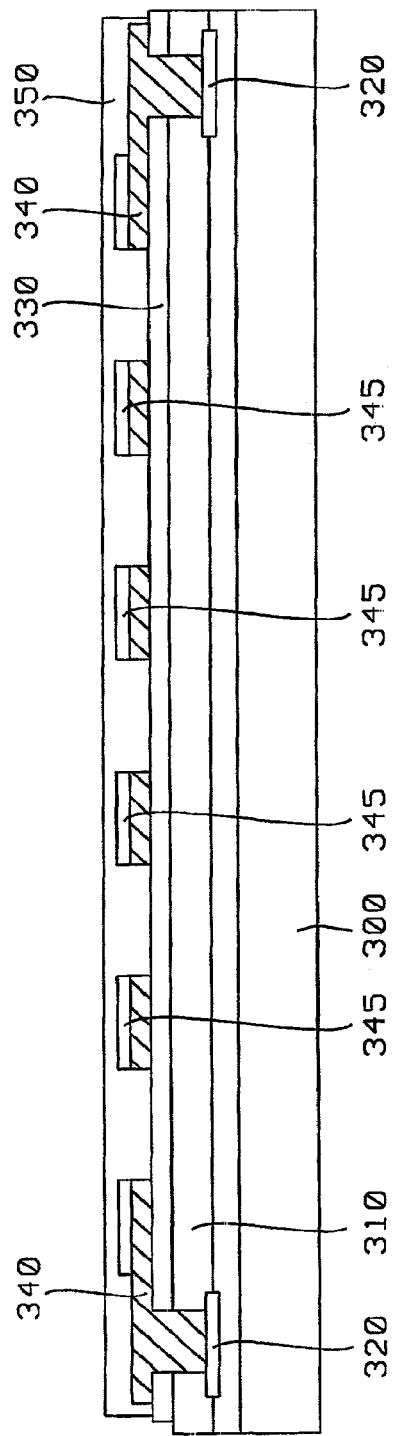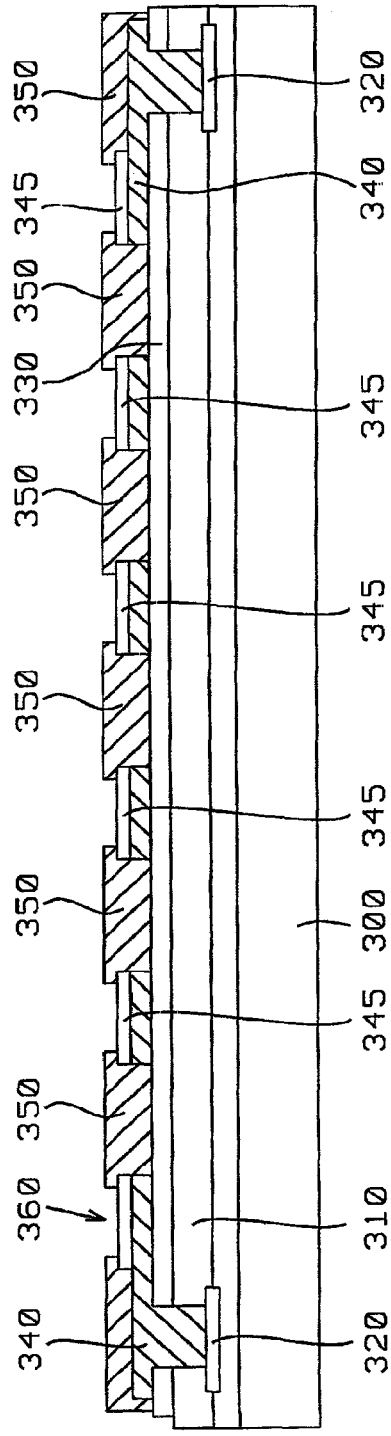
FIG. 3a
FIG. 3b

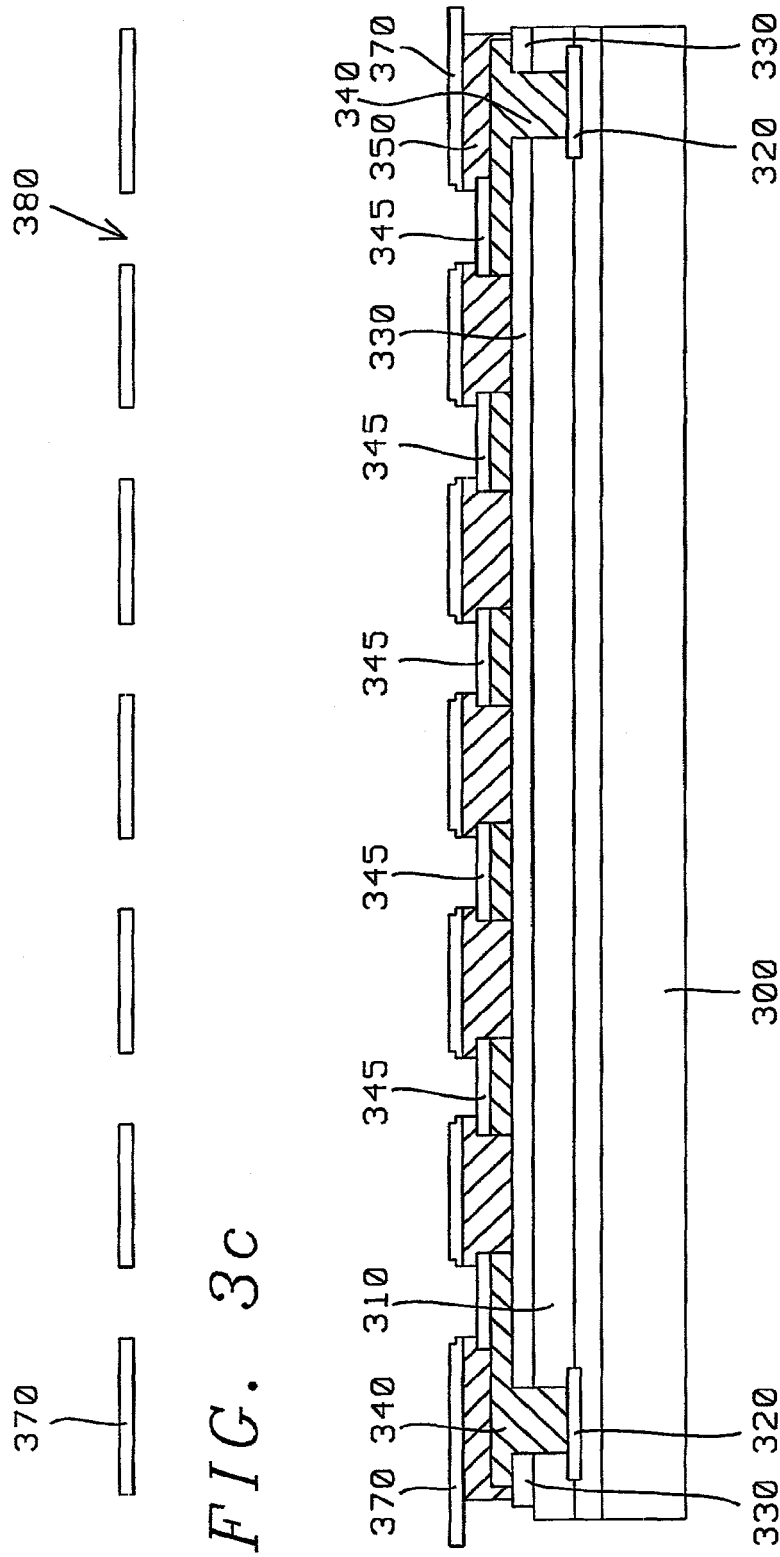

STRUCTURE AND MANUFACTURING METHOD OF CHIP SCALE PACKAGE

This application is a continuation of U.S. patent application Ser. No. 12/512,073, filed Jul. 30, 2009, now U.S. Pat. No. 8,426,982, which is a continuation of U.S. patent application Ser. No. 12/202,341, filed on Sep. 1, 2008, which is a continuation of U.S. patent application Ser. No. 09/821,546, filed on Mar. 30, 2001, now U.S. Pat. No. 7,498,196, assigned to common assignee, the disclosures of which are expressly incorporated by referenced herein in their entireties.

BACKGROUND (1) Field

The present disclosure relates to the manufacture of integrated circuit (IC) chips, and in particular to the packaging of chips at the chip level. At the same time, packaging of chips relates to chip bonding, including the current wire bonding, to Chip Scale Packaging (CSP) test fixture concerns, and the attendant reliability concerns.

(2) Description of the Related Art

Packaging of IC chips determines to a large extent the performance of the system of which the chips are the smallest building blocks. As-one chip must communicate with one or more other neighboring chips in order to perform a system function, the method by which the chips are packaged and interconnected makes a difference in their speed of communication. For example, current mini-BGA (Ball-Grid-Array) packages using wire bonding as interconnection are not as effective in high frequency circuit applications. Also, chip scale packaging (CSP) is important in determining the type of fixtures that must be used for testing. It is disclosed later in the embodiments of the present disclosure a CSP package and a method of manufacturing the same which substantially improves the performance of the IC chips as well as the testing cost of the chips.

As is known in the art, integrated circuits are formed on a silicon wafer which is then diced or cut to form individual die, also called chips. The circuits which are interconnected in each chip terminate at terminals on the chip. The appropriate chips are then interconnected with each other by bonding those terminals onto a card having its own interconnections. Depending upon the complexity and function of the final machine that is to be built, this first level package may in turn be interconnected with other first level cards by connecting the cards onto a second level package, usually called a board.

The chip level interconnection forming the first level package is usually performed using wirebonding (WB), tape automated bonding (TAB), or flip-chip solder connection, sometimes referred to as controlled collapse chip connection (C4). A detailed description of each of these interconnection schemes will not be given here so as to not obscure the key aspects of the present disclosure, and also, as they are not necessary to the understanding of the teachings of the present disclosure.

A conventional first level mini-BGA package, (10), is shown in prior art FIG. 1. The die, or chip (20) is wire-bonded (40) to substrate (30), which in turn is connected to second level package (70) through solder connections (60). The mini-BGA package Ls always encapsulated in a molding material (50). It will be known to those skilled in the art that it would be desirable to eliminate wires (40). Such a method is disclosed later in the embodiments of the present disclosure. Some other prior methods of making connections to chips are disclosed in U.S. Pat. No. 5,994,766 by Shenoy et al., U.S. Pat. No. 6,118,183 by Umehara, et al., U.S. Pat. No. 6,137,164 by Yew et al., U.S. Pat. No. 5,734,201 by Djennas et al, and U.S. Pat. No. 5,914,533 by Frech et al., where they use redistribution layers. Lau, on the other hand, shows a low-cost surface mount compatible land-grid array (LGA) chip scale package (CSP) for packaging solder-bumped flip chips. Higgins also discloses a CSP mounted to a substrate using direct chip attach (DCA) method.

The present disclosure, as disclosed later, differs from prior art in that a CSP is formed by integrating a redistributed chip on a substrate. The I/O solder balls are first mounted through the substrate vias, which in turn are connected to the chip I/O pads. The substrate is attached to the chip by an adhesive.

SUMMARY

It is therefore an aspect the present disclosure to provide a Chip Scale Package (CSP) having improved chip attachment especially suited for high frequency circuit application.

It is another aspect of the present disclosure to provide a more reliable CSP than current CSP.

It is still another aspect of the present disclosure to provide a CSP which leverages current test infrastructure to be more cost effective.

It is yet another aspect of the present disclosure to provide a method of forming CSP with improved interconnections.

A further aspect of the present disclosure to provide a method of attaching chips directly to an adhesive-substrate (adsubstrate) as well as attaching an adhesive-wafer (adwafer) directly to a substrate in order to form CSPs with minimized interconnection lengths and hence, enhanced circuit speed.

One aspect of the present disclosure includes providing a silicon chip having I/O pads; an under-ball metallurgy (UBM) layer on the surface of said I/O pads; a substrate with an adhesive (adsubstrate), and having openings corresponding to the locations of said I/O pads; and ballmountings formed over said adsubstrate and reaching said UBM layer over said I/O pads on said chip.

Another aspect of the present disclosure includes providing a wafer having a plurality of chip sites with I/O pads; forming an under-ball metal (UBM) layer over said I/O pads; forming an adhesive layer over said UBM layer on said wafer to form an adwafer; forming openings in said adhesive layer on said adwafer to reach said I/O pads underlying said UBM layer; die sawing said adwafer to form said chip scale package (CSP); providing a substrate having openings corresponding to said I/O pads; attaching said CSP with said adhesive to said substrate; and forming ball mountings on said openings on said substrate to attach to said I/O pads on said CSP.

BRIEF DESCRIPTION OF THE DRAWINGS

FIG. 1 is a cross-sectional view of a portion of a conventional mini-BGA, according to prior art.

FIG. 2a is a cross-sectional view of a portion of a semiconductor chip showing the forming of an area array I/O pads, according to the aspect of the present disclosure.

FIG. 2aa is a transverse cross-sectional view of a portion of the semiconductor chip of FIG. 2a showing the UBM layer on the I/O pads, according to the aspect of the present disclosure.

FIG. 2f is a cross-sectional view of a portion of a chip package formed by adhering a multiplicity of chips to the adsubstrate of FIG. 2d, according to the aspect of the present disclosure.

FIG. 2g is a cross-sectional view of a portion of the chip package of FIG. 2f showing the encapsulation of the same, according to the aspect of the present disclosure.

FIG. 3a is a cross-sectional view of a portion of a wafer showing the forming of an adhesive layer, according to the aspect of the present disclosure.

FIG. 3b is a cross-sectional view of a portion of the wafer of FIG. 3a showing the opening of the area array I/O pads, according to the aspect of the present disclosure.

FIG. 3c is a cross-sectional view of a portion of a substrate showing the area array openings, according to the aspect of the present disclosure.

FIG. 3d is a cross-sectional view of a portion of the substrate of FIG. 3c and of the wafer of FIG. 3b showing the attachment to each other, according to the aspect of the present disclosure.

DESCRIPTION OF THE PREFERRED EMBODIMENTS

Figure 2B:
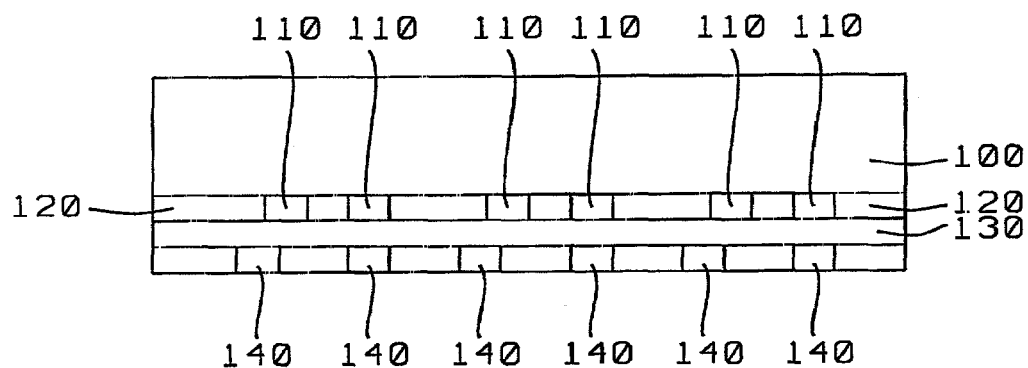
FIG. 2b is a cross-sectional view of a portion of a semiconductor chip showing the redistribution of I/O pads in a redistribution layer to form an area array of I/O pads, according to the aspect of the present disclosure.

Referring now to the drawings, that is, to FIGS. 2a-2i, and FIGS. 3a-3g, there are shown steps of forming a Chip Scale Package (CSP) with improved interconnections.

More specifically, FIGS. 2a and 2b show two single chips die sawed from a wafer, preferably silicon. Chip (100) in FIG. 2a is either already designed to have an area array (AA) of input-output (I/O) pads (110) in passivation layer (120), or, optionally, the same chip in FIG. 2b has normal design I/O pads which have subsequently been redistributed in a re-routing (RR) layer (130) to form redistributed AA pads (140) as shown in FIG. 2b. An under-ball metallurgy layer, comprising nickel and copper, that is, (UBM) layer (115), is also formed over pads (110) or (140), better seen in cross-sectional view in FIG. 2aa. It is important that the pads on chips are generally in an area array configuration for easier connection to the next level of packaging, as is known in the art.

It is also known in the art that chip sites are first formed on a semiconductor substrate to form a wafer, where the substrate is provided with pads (110/115) or (140/115) that are connected to underlying multi-level metal layers through intervening insulating dielectric layers, and ultimately to integrated circuit devices that have already been conventionally formed within and on the substrate. These conventional steps are well known in the art and as they are not significant to the disclosure, they are not described in detail here in order not to unnecessarily obscure the present disclosure. However, it is described below in the embodiments of the present disclosure a new method of forming a chip scale package (CSP) where the I/O ball connections are directly reflowed to the chip pads through vias formed in an intervening next level of substrate.

Figure 2C:
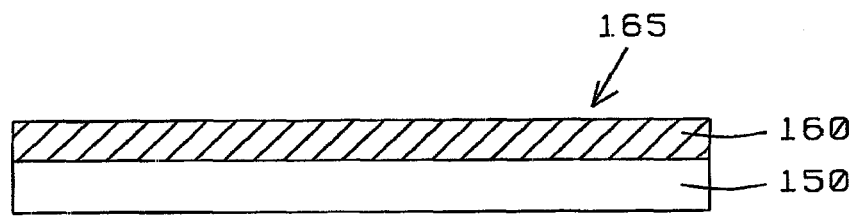
FIG. 2c is a cross-sectional view of a portion of a composite adsubstrate structure comprising an adhesive layer formed over a substrate, according to the aspect of present disclosure.
Figure 2D:
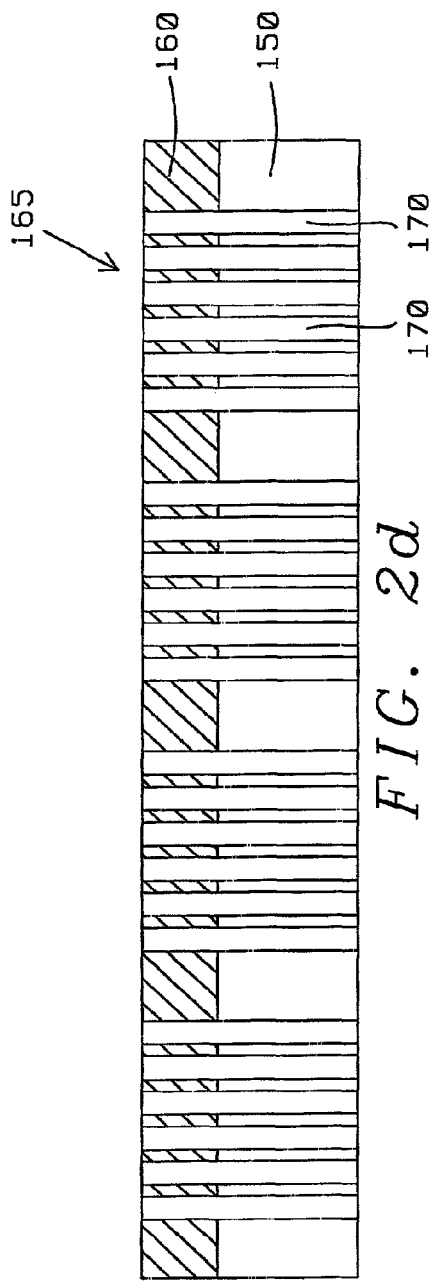
FIG. 2d is a cross-sectional view of a portion of the adsubstrate of FIG. 2c showing the forming of through via holes, according to the aspect of the present disclosure.
Figure 2E:
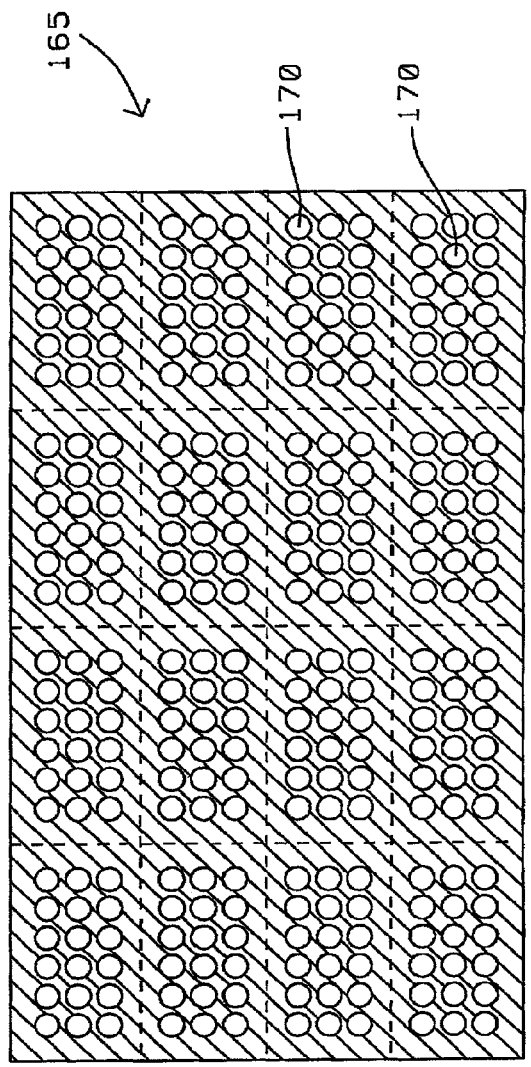
FIG. 2e is a top view of a portion the adsubstrate of FIG. 2d showing the area array of via openings, according to the aspect of the present disclosure.

In one aspect of the present disclosure, substrate (150), preferably a bismaleimide triazine (ST), having a thickness between about 150 to 300 micrometers is mounted with adhered to an adhesive layer (160), having a thickness between about 10 to 100 micrometers. Layer (160) can be a polyimide thermocompression adhesive SPA made by Nippon Steel Chemical. The adhesive and the substrate together form an "adsubstrate" composite structure, reference numeral (165), as shown in FIG. 2c. The composite adsubstrate is then either mechanically drilled, or, preferably laser drilled with an area array of via openings (170) that correspond to AA I/O pads (110) or (140) on the chip, as shown in FIG. 2d. A top view of the adsubstrate with AA openings is also shown in FIG. 2e.

That the vias in the adsubstrate should align with the I/O pads on the chip, for at the next key step, the chips are attached to the adsubstrate to form a chip package, reference numeral (105), as shown in FIG. 2f such that the vias (170) reach the I/O pads. The attachment is achieved by subjecting the chip package to an assembly pressure between about 1.5 to 2.5 Megapascals (Mpa) and at the same time, to a temperature between about 250 to 350.degree. C. Next, the chip package assembly is encapsulated with a molding material (180), preferably, epoxy based resin to a thickness between about 100 to 500 micrometers, as shown in FIG. 2g. It will be obvious to those skilled in the art that other molding materials for electronics can also be used.

Figure 2H:
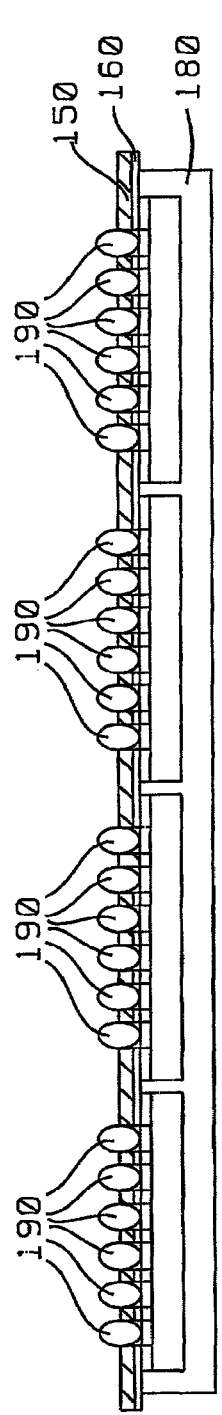
FIG. 2h is a cross-sectional view of a portion of the encapsulate chip package of FIG. 2g showing the forming of ball mounts, according to the aspect of the present disclosure.
Figure 2J:
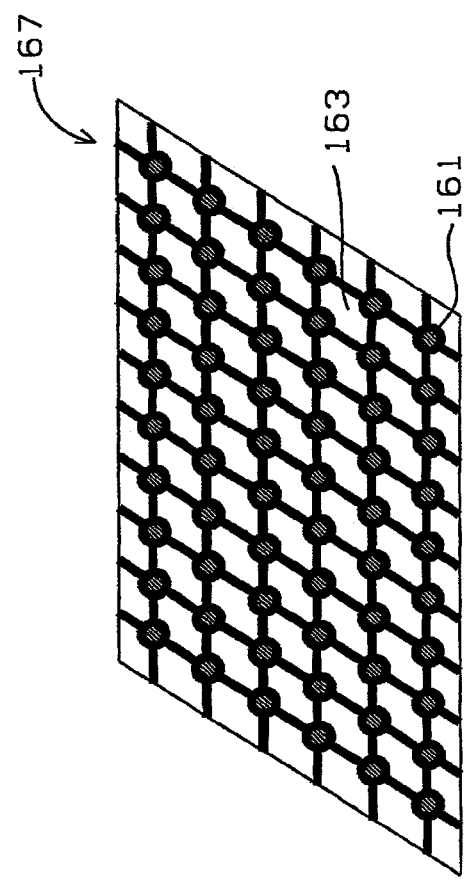
FIG. 2j is a top view of a portion of the patterned stencil where solid areas (161) prevent the adhesive material printing to the substrate while open areas (163) allow the adhesive material to print on the substrate, thus forming the adsubstrate of FIG. 2c, according to the aspect of the present disclosure.
Figure 2I:
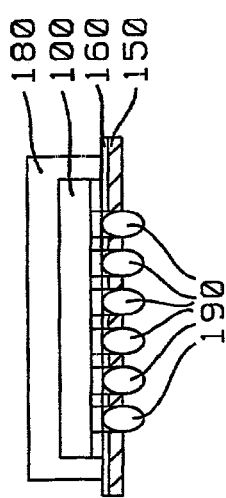
FIG. 2i is a cross-sectional view of a portion of the chip scale package (CSP) of the present disclosure after sawing off of the same from the chip package of FIG. 2h, according to the aspect of the present disclosure.

Another aspect of the present disclosure performs ball mounting over the via openings of the adsubstrate, where the chip package is inverted such that the mounting material (190), preferably, solder is "balled" up as shown in FIG. 2h. It is further preferred that the solder (190) comprises tin-lead, or, tin-silver alloy. During continued process, solder flows to reach the I/O pads at the bottom of the vias, as shown in FIG. 2h. As a final step, the encapsulated chip package is die sawed to form the Chip Scale Package (CSP) of the present disclosure, as shown in FIG. 2i. FIG. 2j shows an alternate method of silk screening an adhesive material on to substrate (167) with holes corresponding to the AA I/O pads on the chip. That is, FIG. 2j is a top view of a portion of the patterned stencil where solid areas (161) prevent the adhesive material (160) printing to the substrate (150) while open areas (163) allow the adhesive material (160) to print on the substrate (150), thus forming the adsubstrate (165) of FIG. 2e.

Figure 3E:
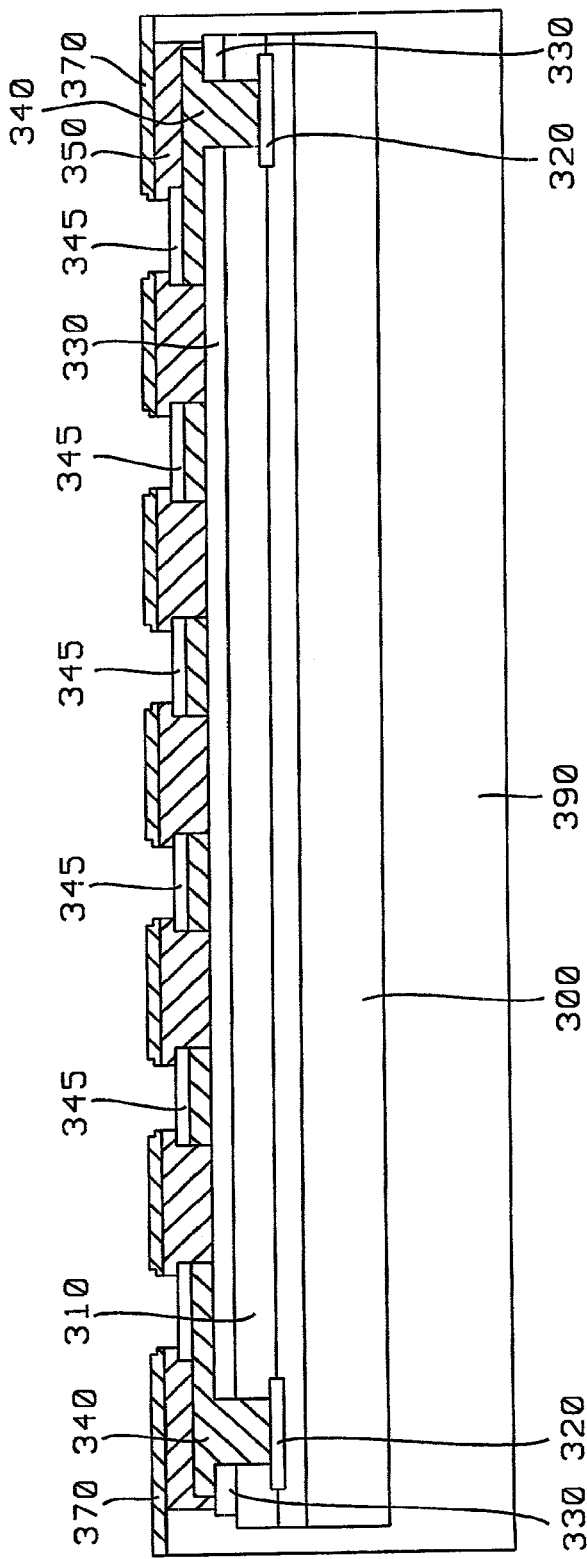
FIG. 3e is a cross-sectional view of a portion of the wafer of FIG. 3d, showing the encapsulation in a molding material, according to the aspect of the present disclosure.

In a second embodiment shown in FIGS. 3a-3f, the main feature is where the adhesive material is applied to wafer (300) to form an "adwafer" first. The adwafer, with a plurality of chip sites, has aluminum pads (320) with an optional re-routing (RR) dielectric layer (330) and passivation layer (310) separating the pads from adhesive layer (350), as shown in FIG. 3a. It will be noted that the I/O pads are connected to RR metal layer (340) which redistributes the ordinary pad configuration to an Area Array (AA) pad configuration where the redistributed AA pads are terminated with a barrier metal (345), which acts as an under-ball metallurgy (UBM) as seen in both FIGS. 3a and 3b. It is preferred that the UBM comprises copper and nickel, and has a thickness between about 1 to 50 micrometers. The adhesive film can be formed on the wafer by either spin coating, screen printing or lamination under pressure, where the latter is preferred.

Openings (360) in adhesive layer (350) reaching barrier metal (345) are next formed by either laser drilling, photo-lithographic methods, or by silk screening the AA configuration onto the adhesive layer in the first place. It is preferred that laser drilling is employed in this instance. The adwafer so prepared is then diced into Chip Scale Packages, or, CSPs.

Figure 3F:
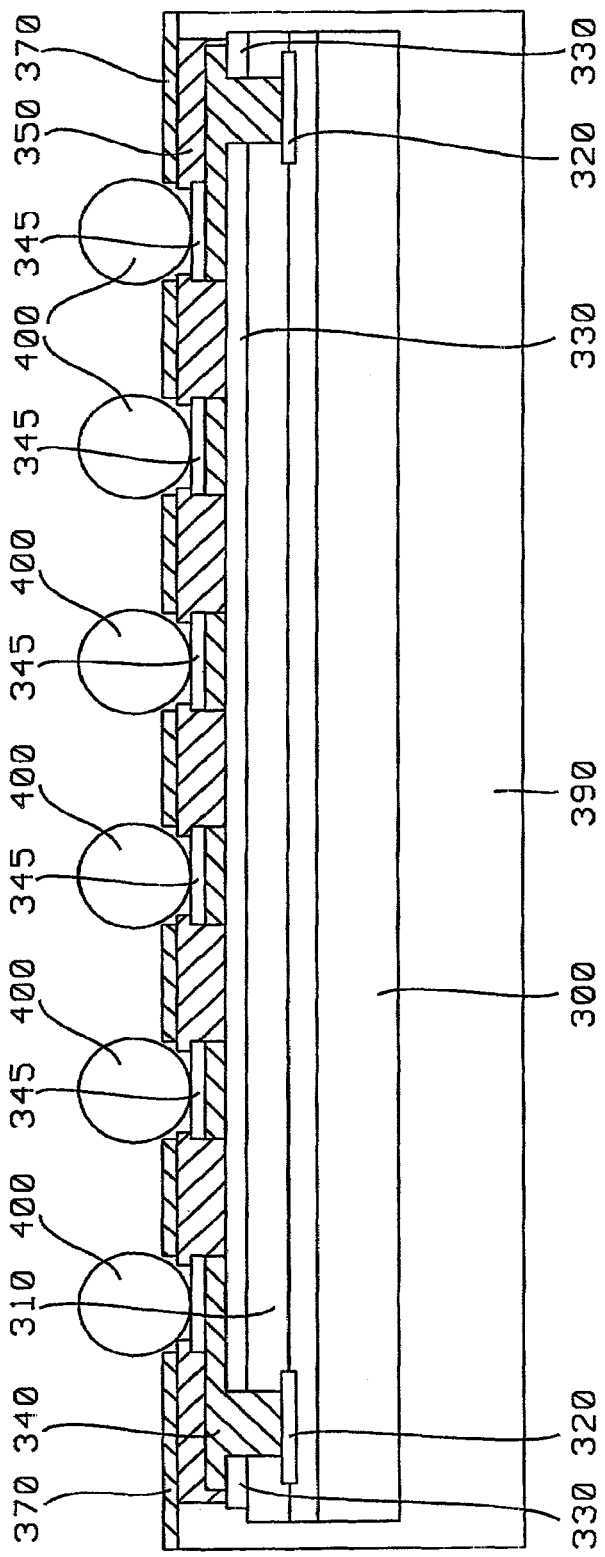
FIG. 3f is a cross-sectional view of a portion of the encapsulated wafer package showing the forming of ball mounts, according to the aspect of the present disclosure.

In the second embodiment, a substrate (370), similar to the BGA substrate (150) used in the first embodiment, is next prepared with drilled via openings (380) corresponding to the AA pad array on the CSPs to be attached as shown in FIG. 3c. It is preferred that substrate (370) comprises BT and has a thickness between about 150 to 300 micrometers. Then the CSP of FIG. 3b is die attached to substrate (370), as shown in FIG. 3d. This is accomplished at a pressure between about 1.5 to 2.5 Mpascals and temperature between about 250 to 350.degree. C. The resulting package is next encapsulated with a molding material (390) using a molding process as shown in FIG. 3e. This is followed by another key feature of the second embodiment, namely, a reflow ball mounting process is performed to form a solder (400) over openings (360) and connected to the AA I/O pads of the chip sites within the wafer, as shown in FIG. 3f. This is accomplished by forming solder (400) comprising tin-lead or tin-silver alloy.

Figure 4:
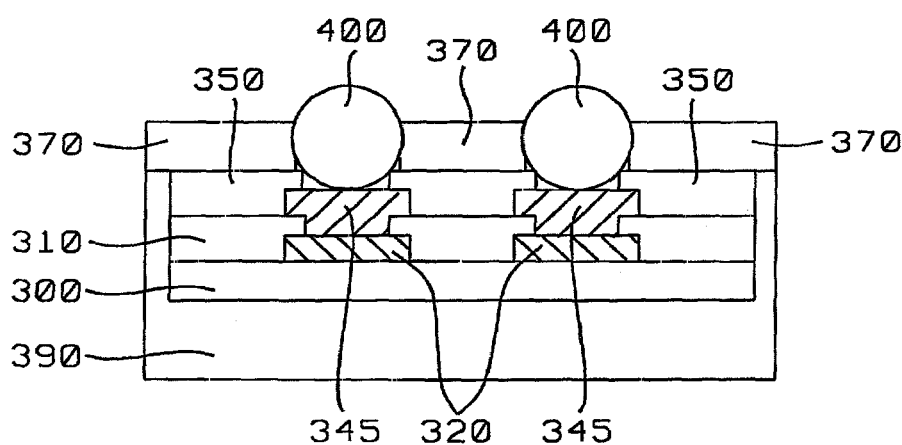
FIG. 4 is a cross-sectional view of a Chip Scale Package (CSP) of the present disclosure, showing that the disclosure can perform on a chip designed without the area array pads, and with no distribution layer, according to the aspect of the present disclosure.

Though these numerous details of the disclosed method are set forth here, such as process parameters, to provide an understanding of the present disclosure, it will be obvious, however, to those skilled in the art that these specific details need not be employed to practice the present disclosure. At the same time, it will be evident that the same methods may be employed in other similar process steps that are too many to cite, such as, for example forming a CSP product without a re-routing metal layer which is replaced by an UBM layer such as shown in FIG. 4.

It will thus be apparent to those skilled in the art that the disclosed embodiments can improve the performance of the various levels of packaging in computers through the use of solder connections in place of wire bonding. At the same time, the disclosed Chip Scale Packaging (CSP) can improve the testing cost by keeping the same body size of chip using the same size substrate. The conventional CSP's on the other hand, have varying body sizes, and therefore, requiring different test fixtures. Even more varying sizes are expected with shrinking product sizes, especially with memory products, and hence, large over-head expenditures for the well-known back-end testing on the production line. This is not the case with the uniformly formed CSPs of the present disclosure. The presently disclosed CSP's can also provide improved thermal reliability by encapsulating the chips with molding materials that will reduce the coefficient of thermal expansion (CTE) mismatch between the silicon chip and the next level of packaging. Hence, molding materials other than those described here may also be used without departing from the letter and spirit of the disclosure.

That is, while the disclosure has been particularly shown and described with reference to the preferred embodiments thereof, it will be understood by those skilled in the art that various changes in form and details may be made without departing from the spirit and scope of the disclosure.

What is claimed is:

1. A chip package comprising:
   a substrate;
   a die having a first side coupled to the substrate, in which a first opening through the substrate exposes the first side of the die, and the die comprises a first conductive layer, a second conductive layer and a passivation layer at the first side of the die, in which a second opening in the passivation layer exposes a first contact point of the first conductive layer, and the first contact point is exposed by the second opening, the second conductive layer is coupled to the first contact point through the second opening, and the second conductive layer has a second contact point exposed by the first opening;
   an adhesive material between the substrate and the first side of the die;
   a conductive interconnect coupled to the die on the second contact point through the first opening;
   a dielectric material coupled to the passivation layer on the first side of the die; and
   a molding material directly coupled to the die and directly coupled to the substrate.

2. The chip package of claim 1, in which the first conductive layer comprises copper.

3. The chip package of claim 1, in which the first conductive layer comprises aluminum.

4. The chip package of claim 1, in which the second conductive layer comprises copper.

5. The chip package of claim 1, in which the second conductive layer comprises nickel.

6. The chip package of claim 1, in which the molding material comprises a polymer.

7. The chip package of claim 1, in which the conductive interconnect comprises a first portion in the first opening, that contacts a sidewall of the first opening, and a second portion that is coupled to the first contact point through the second opening.

8. The chip package of claim 1, wherein said substrate comprises bismaleimide triazine.

9. A chip package comprising:
   a substrate;
   a die having a first side coupled to the substrate, in which an opening through the substrate exposes the first side of the die, and the die comprises a copper layer and a conductive pad at the first side of the die, in the conductive pad is coupled to a first surface of the copper layer, and the conductive pad is exposed by the opening;
   an adhesive material between the substrate and the first side of the die;
   a conductive interconnect coupled to the conductive pad through the opening;
   a dielectric material coupled to a passivation layer on the first side of said die; and
   a molding material directly coupled to the die and directly coupled to the substrate.

10. The chip package of claim 9, in which the conductive pad comprises copper.

11. The chip package of claim 9, in which the conductive pad comprises nickel.

12. The chip package of claim 9, in which the molding material comprises a polymer.

13. The chip package of claim 9, in which the substrate comprises bismaleimide triazine (BT).

14. The chip package of claim 9, in which the conductive pad is directly coupled to the copper layer.

15. A chip package comprising:
   a substrate;

a die having a first side coupled to the substrate, in which an opening through the substrate exposes the first side of the die, and the die comprises a copper layer and a conductive layer at the first side of the die, in which the conductive layer is coupled to a surface of the copper layer, and the conductive layer has a contact point exposed by the opening;

an adhesive material between the substrate and the first side of the die;

a conductive interconnect coupled to the contact point of the conductive layer through the opening;

a dielectric material coupled to a passivation layer on the first side of said die; and a molding material directly coupled to the die and directly coupled to the substrate.

16. The chip package of claim 15, in which the conductive layer comprises copper.

17. The chip package of claim 15, in which the conductive layer comprises nickel.

18. The chip package of claim 15, in which the molding material comprises a polymer.

19. The chip package of claim 15, in which the molding material is further on a second side of the die opposite the first side.

20. The chip package of claim 15, in which the conductive interconnect comprises a solder.

21. The chip package of claim 15, in which the conductive interconnect comprises a first portion that contacts a sidewall of the opening, and a second portion that is coupled to the contact point through the opening.

22. The chip package of claim 15, wherein said substrate comprises bismaleimide triazine.

* * * * *